(12) United States Patent
Giles et al.

(10) Patent No.: US 7,494,876 B1
(45) Date of Patent: Feb. 24, 2009

(54) TRENCH-GATED MIS DEVICE HAVING THICK POLYSILICON INSULATION LAYER AT TRENCH BOTTOM AND METHOD OF FABRICATING THE SAME

(75) Inventors: Frederick Perry Giles, San Jose, CA (US); Kam Hong Lui, Santa Clara, CA (US)

(73) Assignee: Vishay Siliconix, Santa Clara, CA (US)

( * ) Notice: Subject to any disclaimer, the term of this patent is extended or adjusted under 35 U.S.C. 154(b) by 0 days.

(21) Appl. No.: 11/112,403

(22) Filed: Apr. 21, 2005

(51) Int. Cl.
*H01L 21/336* (2006.01)

(52) U.S. Cl. .................. 438/270; 438/156; 438/206; 438/259

(58) Field of Classification Search ......... 438/156–157, 438/138, 173, 212, 268, 206, 136–137, 270, 438/197, 259, 272, 589; 257/213, 288, 327, 257/341, 343, 330, 331–332, 335, 397, 513, 257/E27.091, E29.2, E29.201, E21.585
See application file for complete search history.

(56) References Cited

U.S. PATENT DOCUMENTS

| | | | |
|---|---|---|---|
| 5,283,201 A * | 2/1994 | Tsang et al. | 438/138 |
| 5,321,289 A | 6/1994 | Baba et al. | |
| 5,502,320 A | 3/1996 | Yamada | |
| 5,637,898 A | 6/1997 | Baliga | 257/330 |
| 5,914,503 A * | 6/1999 | Iwamuro et al. | 257/133 |
| 5,998,833 A | 12/1999 | Baliga | |
| 6,084,264 A * | 7/2000 | Darwish | 257/329 |
| 6,255,683 B1 | 7/2001 | Radens et al. | |
| 6,548,860 B1 | 4/2003 | Hshieh et al. | |
| 6,882,000 B2 | 4/2005 | Darwish et al. | |
| 6,921,697 B2 | 7/2005 | Darwish et al. | |

FOREIGN PATENT DOCUMENTS

JP H03-211885 9/1991

(Continued)

OTHER PUBLICATIONS

Suzuki et al. (Suzuki)-JP Patent Laid Open No. H11-068102.

(Continued)

*Primary Examiner*—Davienne Monbleau
*Assistant Examiner*—DiLinh Nguyen (57) ABSTRACT

In a trench-gated MIS semiconductor device, a slug of undoped polysilicon is deposited at the bottom of the trench to protect the gate oxide in this area against the high electric fields that can occur in this area. The slug is formed over a thick oxide layer at the bottom of the trench. A process of fabricating the MOSFET includes the steps of growing a thick oxide layer on the sidewalls and bottom of the trench, depositing a polysilicon layer which remains undoped, etching the polysilicon layer to form the plug, etching the exposed portion of the thick oxide layer, growing a gate oxide layer and an oxide layer over the plug, and depositing and doping a polysilicon layer which serves as the gate electrode. In an alternative embodiment, the oxide layer overlying the plug is etched before the gate polysilicon is deposited such that the dopant introduced into the gate polysilicon migrates into the polysilicon plug. In this embodiment, the polysilicon plug is in electrical contact with the gate polysilicon layer and is separated from the drain by the thick oxide layer.

8 Claims, 10 Drawing Sheets

FOREIGN PATENT DOCUMENTS

| | | |
|---|---|---|
| JP | H10-173175 | 6/1998 |
| JP | S63-296282 | 12/1998 |
| JP | H11-068102 | 1/2008 |
| WO | 94/03922 | 2/1994 |
| WO | 00/25365 | 5/2000 |
| WO | 2000/25363 | 5/2000 |

OTHER PUBLICATIONS

Otsu et al. (Otsu)-JP Patent laid Open No. S63-296282.

* cited by examiner

TRENCH-GATED MIS DEVICE HAVING THICK POLYSILICON INSULATION LAYER AT TRENCH BOTTOM AND METHOD OF FABRICATING THE SAME

CROSS-REFERENCE TO RELATED APPLICATION

This application claims priority from co-pending U.S. patent application Ser. No. 09/591,179, filed on Jun. 8, 2000, entitled "TRENCH-GATED MIS DEVICE HAVING THICK POLYSILICON INSULATION LAYER AT TRENCH BOTTOM AND METHOD OF FABRICATING THE SAME," by Giles et al., and assigned to the assignee of the present application, which is herein incorporated by reference.

FIELD OF THE INVENTION

This invention relates to metal-insulator-silicon (MIS) devices and in particular a trench-gated MIS device having polysilicon as the gate material.

BACKGROUND OF THE INVENTION

There is a class of metal-insulator-silicon (MIS) devices in which the gate is formed in a trench that extends downward from the surface of the silicon or other semiconductor material. The gate is typically formed of polycrystalline silicon (polysilicon) and is insulated from the silicon by a layer of oxide that lines the sidewalls and bottom of the trench. The current flow in such devices is primarily vertical and as a result the cells can be more densely packed. All else being equal, this increases the current carrying capability and reduces the on-resistance of the device. Devices that fit into the general category of MIS devices include metal-oxide-silicon field-effect transistors (MOSFETs), insulated gate bipolar transistors (IGBTs) and MOS-gated thyristors.

Figure 1:
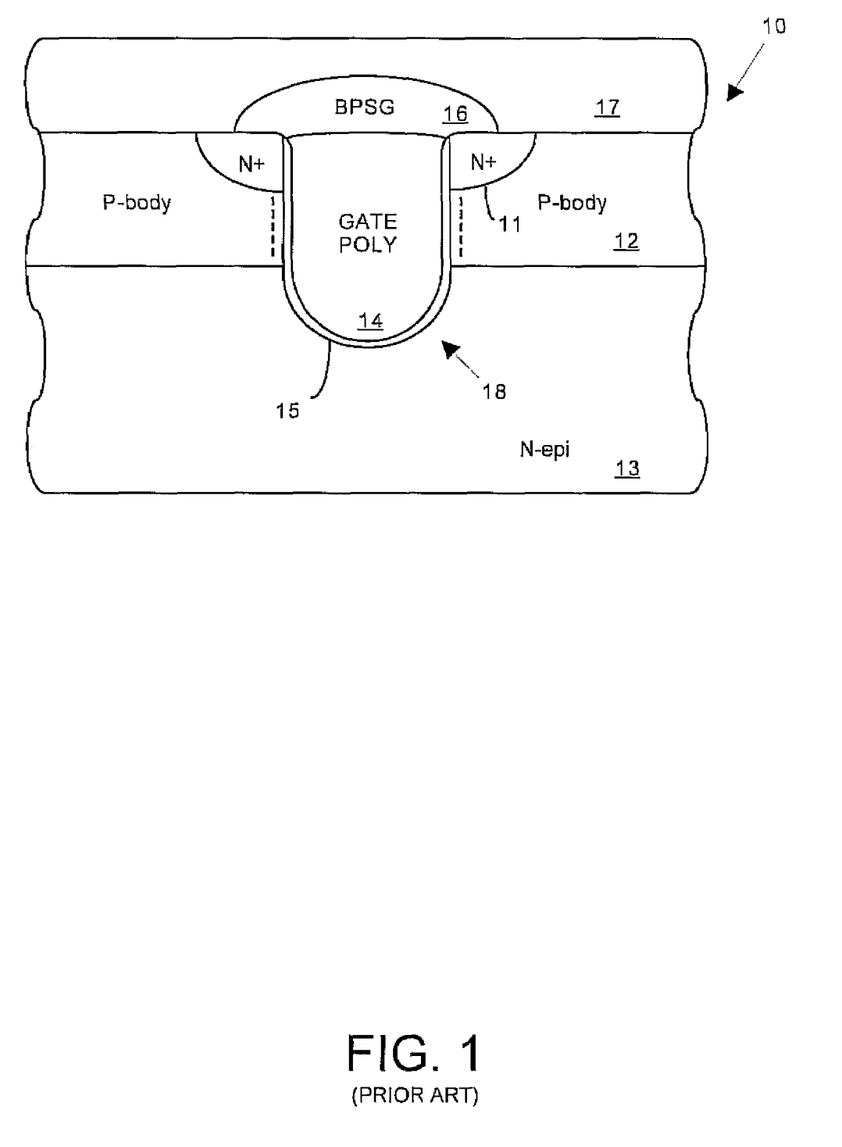
FIG. 1 is a cross-sectional view of a conventional MOSFET.

A cross-sectional view of a typical N-channel trench-gated MOSFET is shown in FIG. 1. In MOSFET 10, N+ region 11 is the source, P region 12 is the body, and N-epi layer 13 is the drain. Current flows vertically through a channel (denoted by the dashed lines). The sidewalls and bottom of the trench are lined with a gate oxide layer 15 and the trench is filled with doped polysilicon which forms the gate 14. The doped polysilicon in the trench is covered with a layer 16 of borophosphosilicate (BPSG) glass, and electrical contact to the source and body regions is made by a metal layer 17. The gate 14 is contacted in the third dimension (outside the plane of the drawing).

Methods of manufacturing trench-gated devices are well known. The top surface of the silicon is masked and a dry/plasma etch is used to cut the trench. A sacrificial oxide layer is thermally grown on the walls of the trench, and removed, to eliminate crystal damage caused by the dry etch. Then a thin gate oxide layer is thermally grown. Finally, doped polysilicon is used to completely fill the trench and form the gate electrode.

One problem that occurs with trench-gated devices derives from the fact that the gate oxide layer at the bottom of the trench is subjected to the drain operating voltage (in the region designated 18 in FIG. 1). This condition (a) limits the drain-voltage rating of the device, (b) presents a long-term gate oxide reliability problem, and (c) greatly increases the gate-to-drain capacitance of the device, limiting its switching speed.

SUMMARY OF THE INVENTION

In accordance with this invention, an MIS device comprises a semiconductor chip having a trench extending from a surface of the semiconductor chip; a source region of a first conductivity type adjacent a sidewall of the trench and the surface of the chip; a body region of a second conductivity type opposite to the first conductivity type adjacent the source region and the sidewall of the trench; and a drain region of the first conductivity type adjacent the body region and the sidewall of the trench, wherein the trench is lined with a first layer of gate oxide along a portion of the sidewall that abuts the body region and wherein the trench is lined with a second layer which comprises a plug of undoped polysilicon at the bottom of the trench, the second layer being thicker than the first layer.

In one embodiment the second layer comprises a second oxide layer.

The invention also includes a method of fabricating an MIS device comprising forming a trench in a semiconductor chip; growing a first oxide layer on the sidewall and bottom of the trench; depositing undoped polysilicon in the trench; etching a portion of the undoped polysilicon to expose a portion of the first oxide layer while leaving a plug of undoped polysilicon at the bottom of the trench; etching an exposed portion of the first oxide layer to expose a portion of the sidewall of the trench; growing a gate oxide layer on the exposed portion of the sidewall; and forming a gate of doped polysilicon above the plug of undoped polysilicon and adjacent the gate oxide layer.

The method may also include growing a second oxide layer on the undoped polysilicon plug and depositing a polysilicon layer over the second oxide layer such that the second oxide layer separates the gate and the undoped polysilicon plug.

According to another aspect, the method comprises etching the second oxide layer before depositing the polysilicon layer such that the polysilicon layer is in contact with the undoped polysilicon plug. In this case, the contact between the polysilicon layer and the undoped polysilicon plug causes dopant to enter the undoped polysilicon plug.

BRIEF DESCRIPTION OF THE DRAWINGS

The invention will be best understood by referring to the drawings, in which similar elements are given the same reference numeral and in which.

DESCRIPTION OF THE INVENTION

Figure 2:
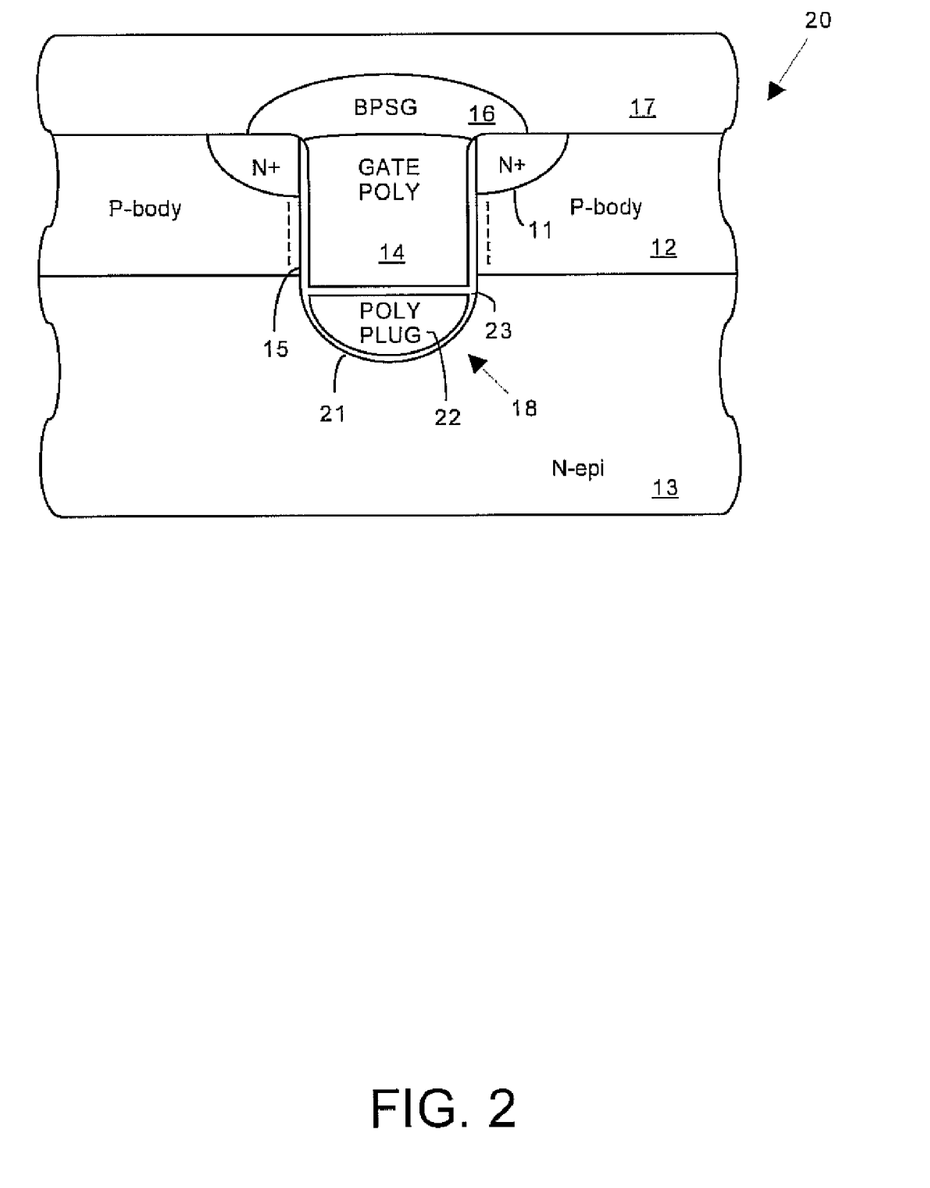
FIG. 2 is a cross-sectional view of a MOSFET in accordance with this invention.

FIG. 2 shows a first embodiment of this invention. The elements of MOSFET 20 outside the trench can be the same as those of MOSFET 10 shown in FIG. 1. The bottom of the trench is lined, however, with a thin oxide layer 21, and oxide layer 21 is overlain by a plug 22 of undoped polysilicon. A second oxide layer 23 separates polysilicon plug 22 from gate 14, which as is customary is formed of doped polysilicon so that it is conductive. Since undoped polysilicon is nonconductive, polysilicon plug 22 acts as a thick insulating layer which, along with oxide layers 21 and 23, separates the gate 14 from the drain region of the MOSFET (N-epi layer 13). In the trench areas covered by polysilicon plug 22, this circumvents the problems that occur when all that separates the gate and the drain is a thin oxide layer as shown in FIG. 1.

Figure 3:
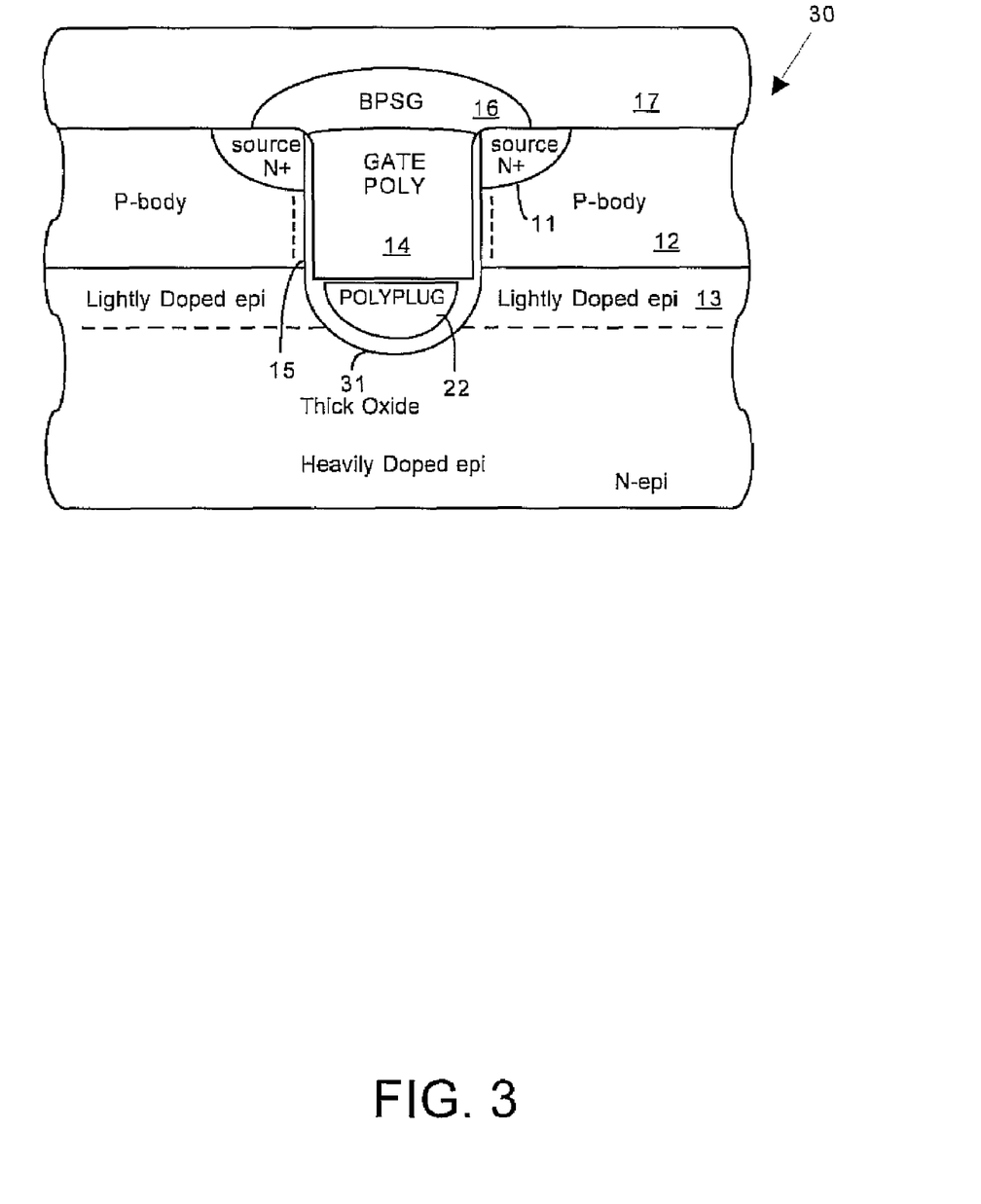
FIG. 3 is a cross-sectional view of an alternative embodiment of a MOSFET in accordance with this invention.

A second embodiment is shown in FIG. 3. MOSFET 30 is similar to MOSFET 20 except that a relatively thick oxide layer 31 has been formed at the bottom of the trench prior to the deposition of the undoped polysilicon plug 22.

In FIGS. 2 and 3, gate oxide layer 15 represents a first layer along a portion of the sidewall of the trench that abuts P-body 12 and the trench is lined with a second layer that comprises plug 22 of undoped polysilicon at the bottom of the trench. The second layer also comprises a second oxide layer (21, 31) and a third oxide layer (23).

Figure 4A:
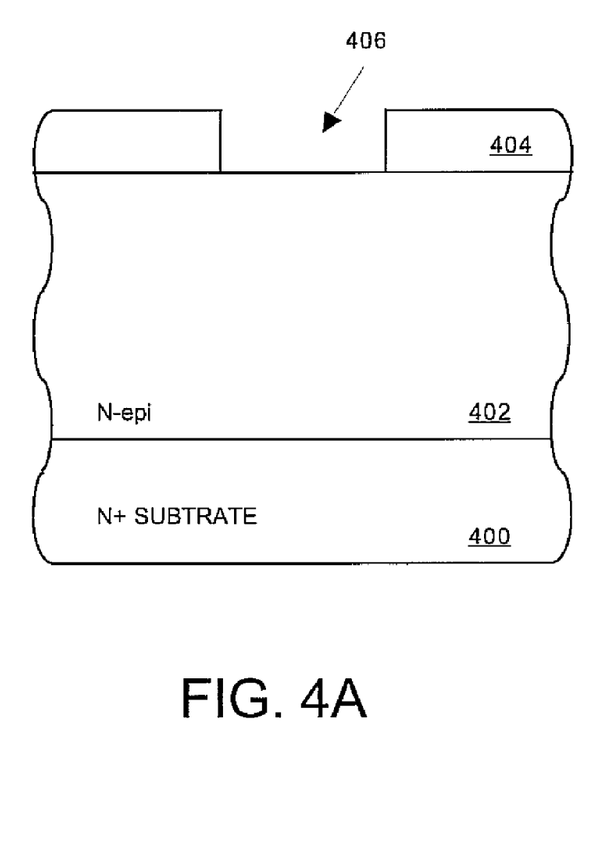
FIGS. 4A-4J illustrate a sequence of steps in one process for fabricating a MOSFET in accordance with this invention.

FIGS. 4A-4J show the steps of a process for fabricating a MOSFET of the kind shown in FIG. 3. As shown in FIG. 4A, the process begins with a heavily-doped N+ substrate 400, on which a lightly-doped N-epi layer 402 is grown. A photoresist trench mask 404 is deposited on the surface of N-epi layer 402, with an opening 406 where the trench is to be located.

Figure 4B:
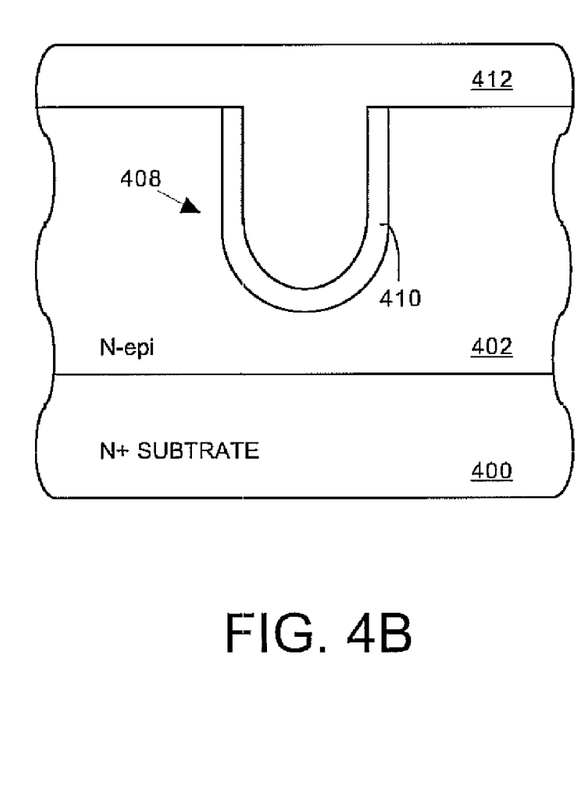

As shown in FIG. 4B, a trench 408 is etched through the opening 406 typically by a dry/plasma etch (for example, a reactive ion etch (RIE)). Illustratively, N-epi layer 402 may be 8 µm thick and trench 408 may be 1.5 µm deep. Mask 404 is removed, and a thick oxide layer 410 is thermally grown on the walls of trench 408 at, for example, 1050° C. for 50 minutes, producing a 700 Å thick oxide layer 410. A layer 412 of undoped polysilicon is then deposited, filling trench 408 and overflowing onto the surface of N-epi layer 402.

Figure 4C:
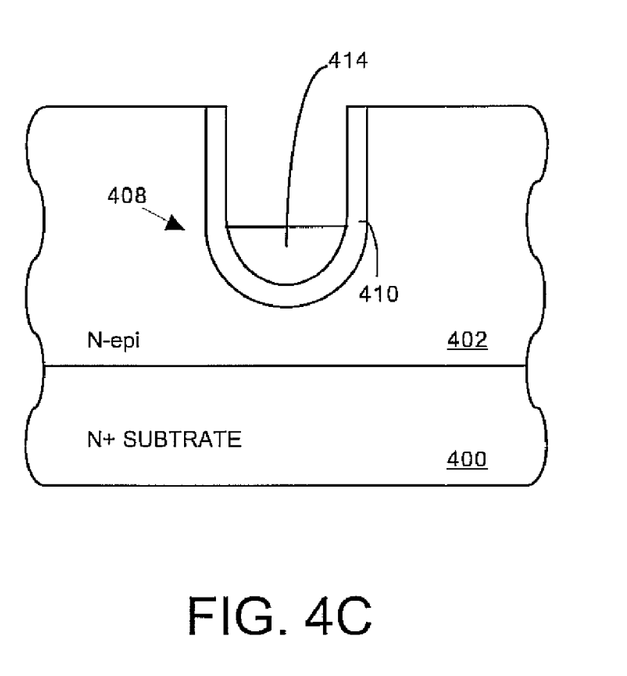

As shown in FIG. 4C, polysilicon layer 412 is etched back, using a reactive ion etch, such that only a plug 414 of undoped polysilicon remains on top of thick oxide layer 410 at the bottom of trench 408. Illustratively, polysilicon plug 414 is 0.3 µm thick at the center of trench 408.

Figure 4D:
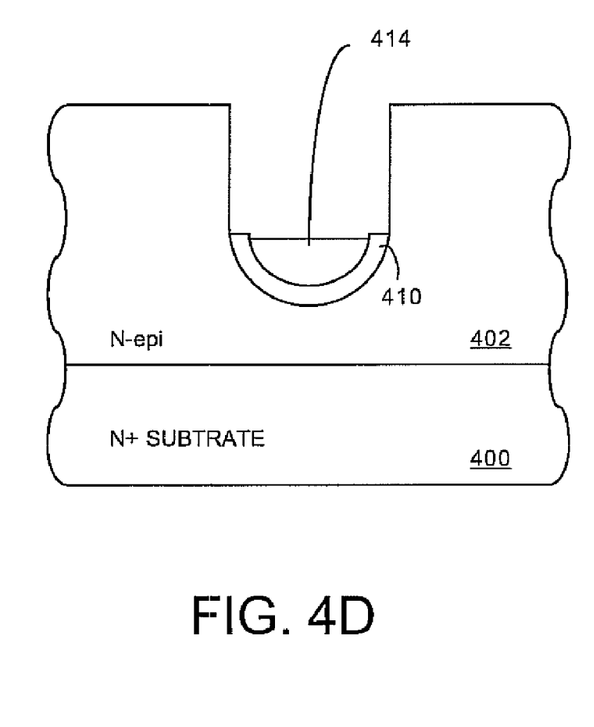

Thick oxide layer 410 is etched from the sidewalls of trench, yielding the structure shown in FIG. 4D.

Figure 4E:
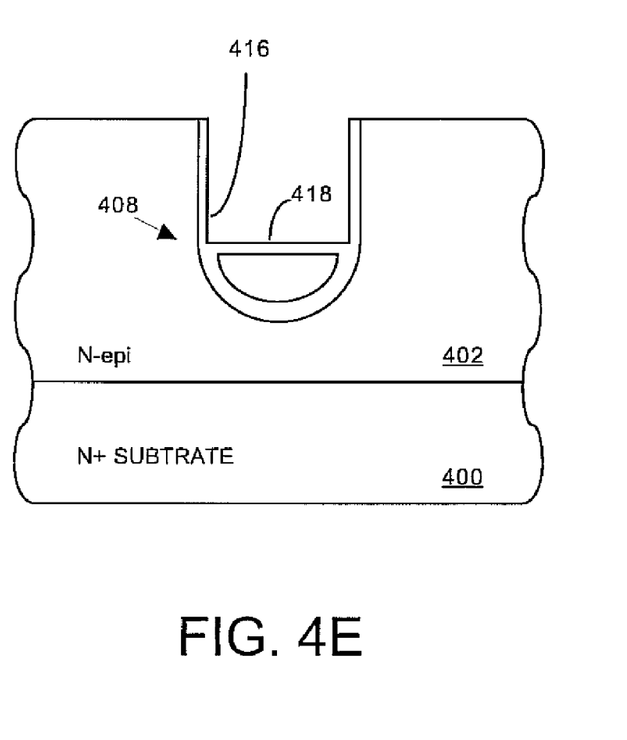

The structure is heated to 1050° C. for 35 minutes to form a gate oxide layer 416 on the sidewalls of trench 408. Gate oxide layer 416 may be, for example, 500 Å thick. A thin oxide layer 418 also forms on the top surface of polysilicon plug 414, as shown in FIG. 4E.

Figure 4F:
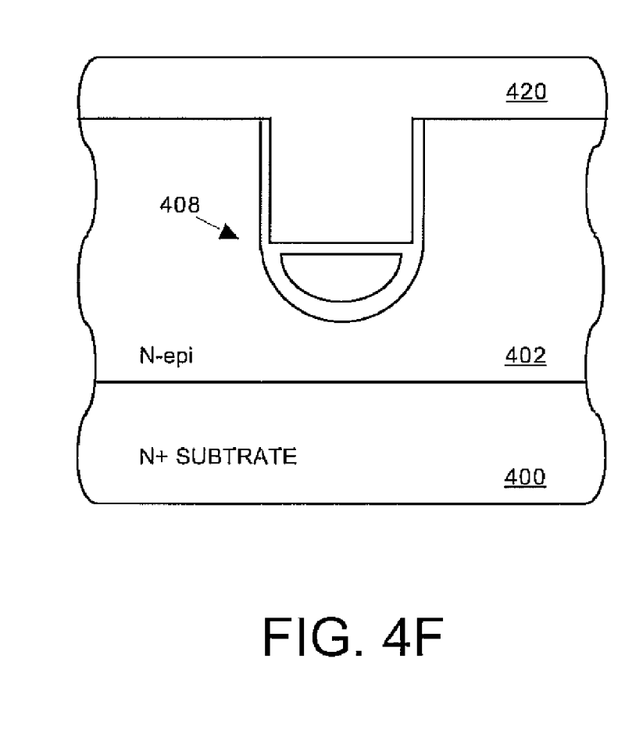

A layer 420 of polysilicon is deposited in trench 408 and overflows onto the top surface of N-epi layer 402, as shown in FIG. 4F. In an N-channel MOSFET, polysilicon layer 420 can be doped to a concentration of $1 \times 10^{20}$ $cm^{-3}$, for example. The doping is performed after deposition using, for example, a $POCl_3$ process.

Figure 4G:
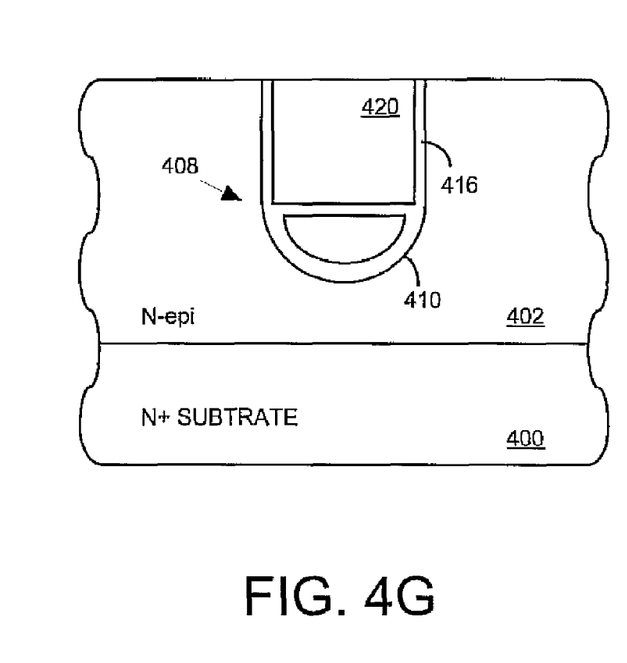

After doping, polysilicon layer 420 is etched back until the top surface of layer 420 is approximately level with the top surface of N-epi layer 402, as shown in FIG. 4G.

Figure 4H:
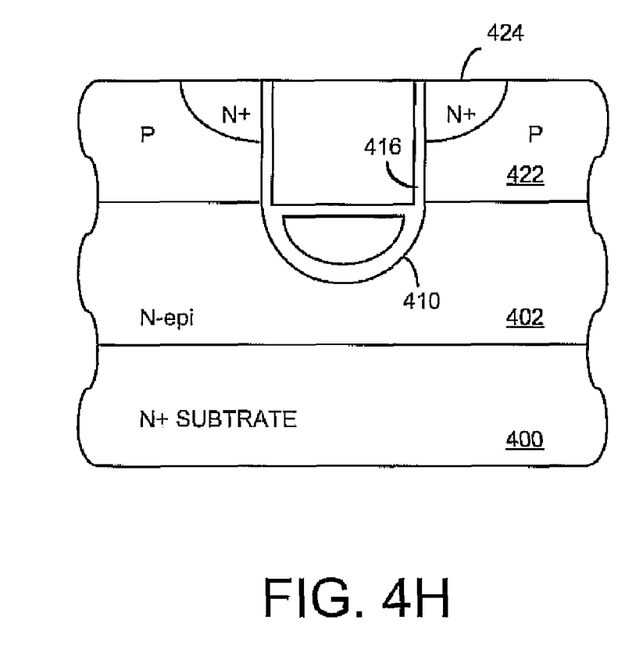

Using known implantation and diffusion processes, a P-body region 422 and an N+ source region 424 are formed in N-epi layer 420. The PN junction between P-body region 422 and the remaining N−portion of epi layer 402 is located at a level above the interface between thick oxide layer 410 and gate oxide layer 416, as shown in FIG. 4H.

Figure 4I:
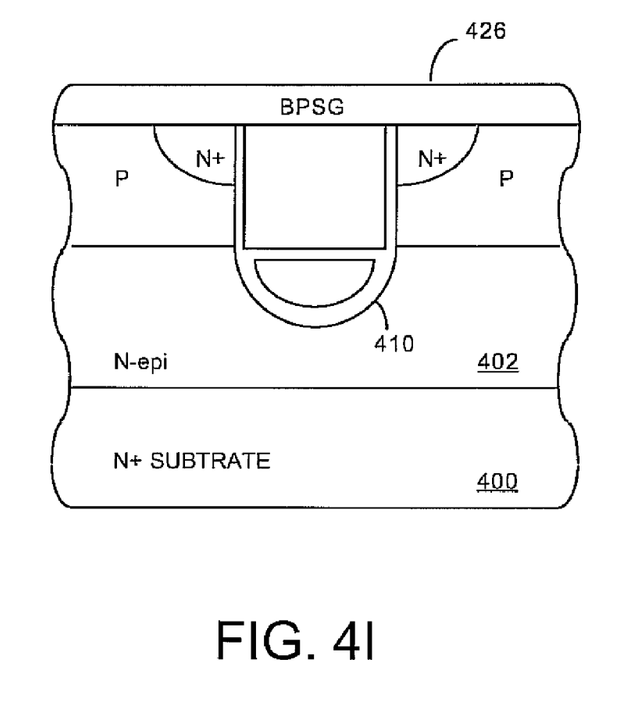
Figure 4J:
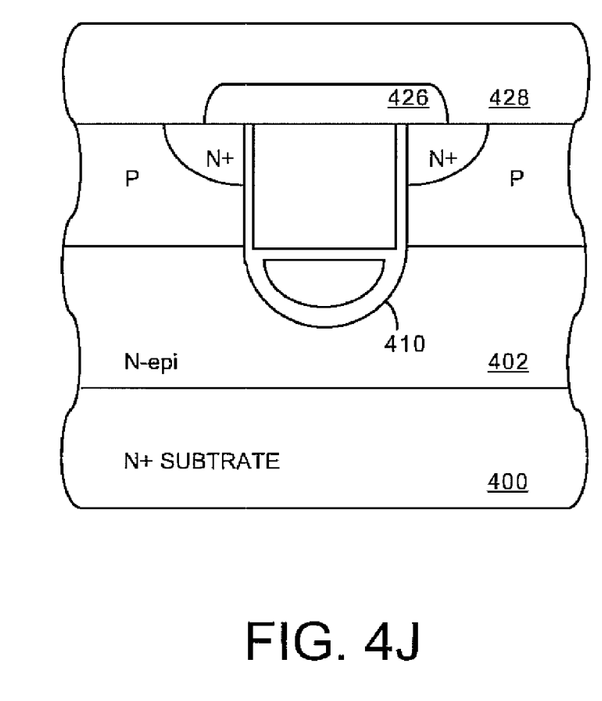

A layer 426 of borophosphosilicate glass (BPSG) is deposited on the surfaces of N-epi layer 402 and doped polysilicon 420, as shown in FIG. 4I. BPSG layer 426 is etched as shown in FIG. 4J, and a metal layer 428 is deposited to make an electrical contact with N+ source region 424 and P-body region 422. Metal contact to the drain (not shown) is made on the opposite surface of N+ substrate 400.

Figure 5A:
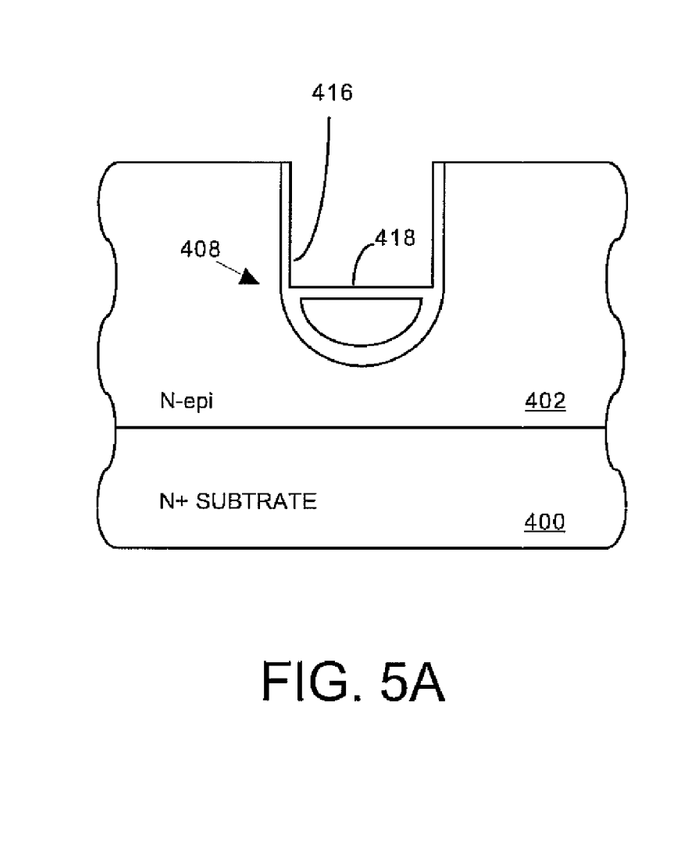
FIGS. 5A-5C illustrate a variation of a portion of the process illustrated in FIGS. 4A-4J.
Figure 5B:
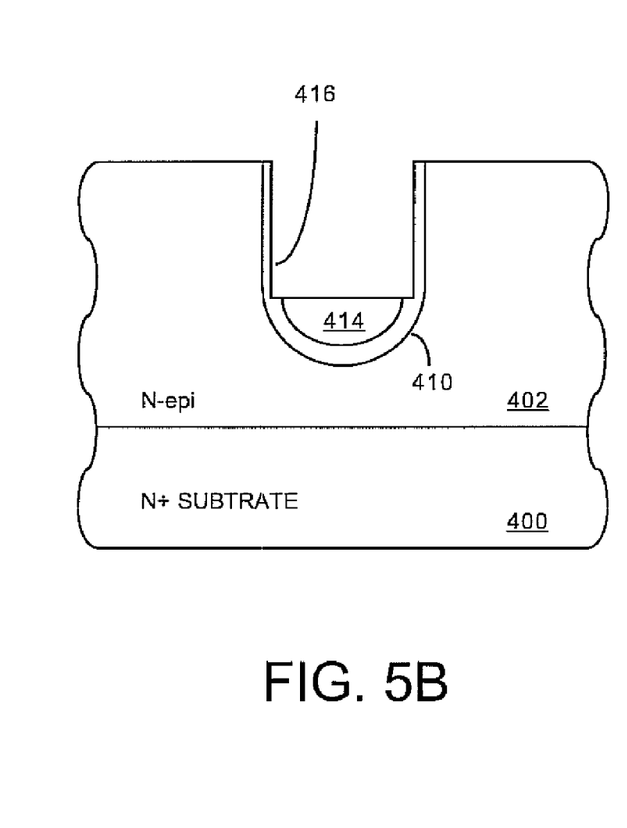
Figure 5C:
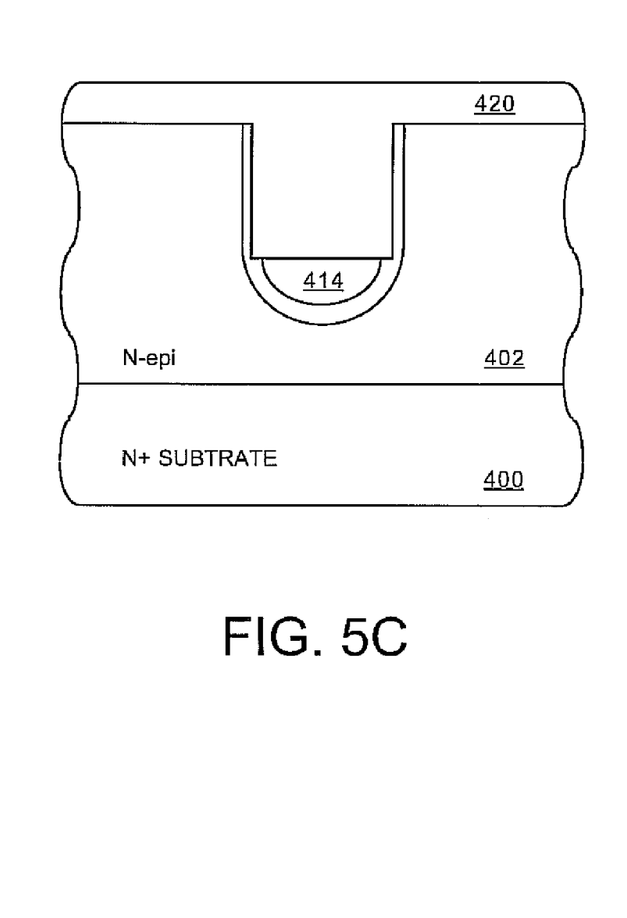
Figure 5D:
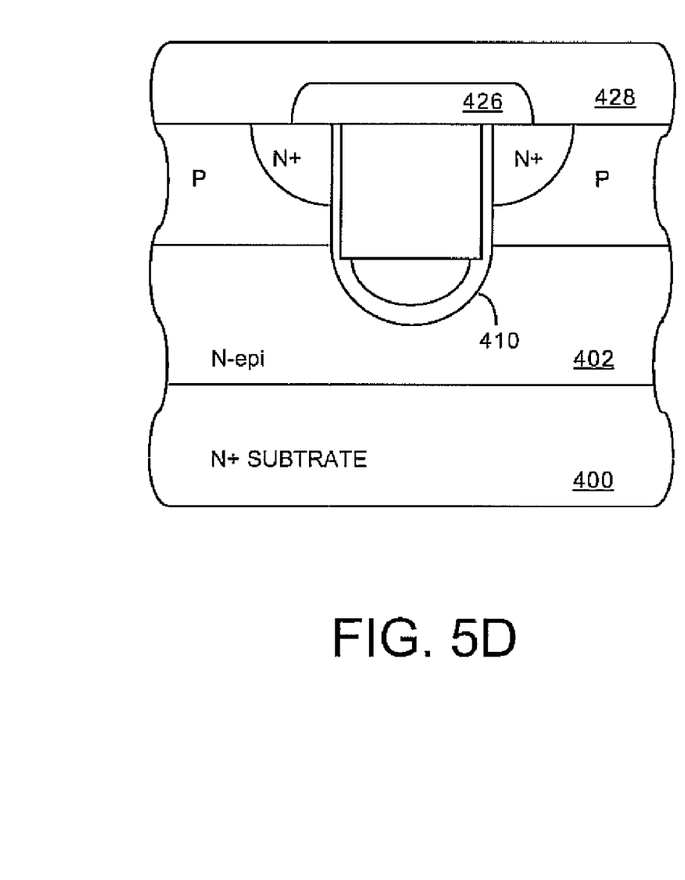
FIG. 5D is a cross-sectional view of a MOSFET produced by the process shown in FIGS. 4A-4E, 5A-5C and 4G-4J.

An alternative process is illustrated in FIGS. 5A-5C. The steps illustrated in FIGS. 4A-4E are followed as described above. FIG. 5A shows the structure of the MOSFET at the stage shown in FIG. 4E. Before the polysilicon layer 420 is deposited, the thin oxide layer 418 on the top surface of polysilicon plug 414 is etched using a directional etch, such as a dry plasma etch. This yields the structure shown in FIG. 5B, with gate oxide layer 416 on the sidewalls of the trench and thick oxide layer 410 and polysilicon plug 414 at the bottom of the trench. Polysilicon layer 420 is then deposited and doped using a $POCl_3$ process. Since polysilicon layer 420 is in contact with polysilicon plug 414, the dopant diffuses through layer 420 and into polysilicon plug 414. The remaining steps shown in FIGS. 4G-4J are then carried out as described above to form the MOSFET shown in FIG. 5D, wherein polysilicon layer 420 and plug 414 together form a gate electrode that is separated from the drain (N-epi layer 402) by the thick oxide layer 410.

While specific embodiments of this invention have been described herein, these embodiments are to be treated as illustrative and not limiting. For example, the structures and methods of this invention can be used with any type of MIS device where it is desirable to form an insulating layer between a trench gate and a region outside the trench. It will be understood by those skilled in the art that numerous alternative embodiments are possible in accordance with the broad principles of this invention.

We claim:

1. A method of fabricating an MIS device comprising:
   forming a trench in a semiconductor chip comprising an N-epi layer atop an N+ substrate, the trench having a sidewall and a bottom, wherein the trench is formed in the N-epi layer and does not extend to the N+ substrate;
   growing a first oxide layer on the sidewall and bottom of the trench;
   depositing undoped polysilicon in the trench;
   etching a portion of the undoped polysilicon to expose a portion of the first oxide layer while leaving a plug of undoped polysilicon at the bottom of the trench;
   etching the exposed portion of the first oxide layer to expose a portion of a sidewall of the trench;
   growing a gate oxide layer on the exposed portion of the sidewall;
   growing a second oxide layer on the undoped polysilicon plug;
   depositing a polysilicon layer in the trench that overflows onto a top surface of the N-epi layer, the polysilicon layer for forming a gate and is adjacent to the gate oxide and the second oxide layer; and
   etching back the polysilicon layer until its top surface is approximately level with the top surface of the N-epi layer.

2. The method of claim 1 wherein the undoped polysilicon plug is used as an etch stop for the portion of the first oxide layer beneath the undoped polysilicon plug during the etching of the exposed portion of the first oxide layer.

3. The method of claim 1 further comprising doping the polysilicon layer before the etching back.

4. The method of claim 3 further comprising depositing a glass layer above the N-epi layer after the etching back.

5. The method of claim 4 comprising etching the second oxide layer to expose the undoped polysilicon plug before depositing the polysilicon layer such that the polysilicon layer is in contact with the undoped polysilicon plug.

6. The method of claim 5 wherein doping the polysilicon layer causes dopant to enter the undoped polysilicon.

7. The method of claim 1 wherein growing the gate oxide layer and growing the second oxide layer occur substantially simultaneously.

8. The method of claim 1 further comprising forming a P-body region and an N+ source region in the N-epi layer after the etching back.

* * * * *